United States Patent
Ozeki et al.

(10) Patent No.: US 11,996,502 B2
(45) Date of Patent: May 28, 2024

(54) METHOD OF MANUFACTURING LIGHT-EMITTING DEVICE INCLUDING STEP OF CURING SEALING MEMBER WHILE APPLYING CENTRIFUGAL FORCE

(71) Applicant: NICHIA CORPORATION, Anan (JP)

(72) Inventors: Kenji Ozeki, Tokushima (JP); Atsushi Kojima, Tokushima (JP); Chinami Nakai, Anan (JP)

(73) Assignee: NICHIA CORPORATION, Anan (JP)

( * ) Notice: Subject to any disclaimer, the term of this patent is extended or adjusted under 35 U.S.C. 154(b) by 114 days.

(21) Appl. No.: 16/817,796

(22) Filed: Mar. 13, 2020

(65) Prior Publication Data
US 2020/0295242 A1   Sep. 17, 2020

(30) Foreign Application Priority Data

Mar. 15, 2019  (JP) ................ 2019-048979

(51) Int. Cl.
*H01L 33/52*      (2010.01)
*H01L 33/00*      (2010.01)
*H01L 33/50*      (2010.01)
*H01L 33/54*      (2010.01)
(Continued)

(52) U.S. Cl.
CPC ............ *H01L 33/52* (2013.01); *H01L 33/005* (2013.01); *H01L 33/502* (2013.01); *H01L 33/54* (2013.01); *H01L 33/60* (2013.01); *H01L 33/62* (2013.01); *H01L 2933/005* (2013.01)

(58) Field of Classification Search
CPC ....... H01L 2933/0041; H01L 2933/005; H01L 33/56; H01L 2924/181; H01L 33/54; H01L 33/005; H01L 33/52; H01L 33/502; H01L 33/62; H01L 33/60

USPC ...... 438/15; 257/98, 23.031, 33.056, 33.061, 257/33.067
See application file for complete search history.

(56) References Cited

U.S. PATENT DOCUMENTS

| | | | |
|---|---|---|---|
| 2005/0221519 A1* | 10/2005 | Leung ................ | H01L 33/58 257/E33.059 |
| 2010/0006880 A1* | 1/2010 | Wang ................. | H01L 33/508 257/E33.059 |
| 2010/0112734 A1 | 5/2010 | Koizumi et al. | |

(Continued)

FOREIGN PATENT DOCUMENTS

| | | |
|---|---|---|
| JP | 2008311477 A  * | 12/2008 |
| JP | 2009-135485 A | 6/2009 |

(Continued)

OTHER PUBLICATIONS

KR-101875344-B1 Machine English Translation (Year: 2018).*
JP-2008311477-A Eng Machine Translation (Year: 2008).*

*Primary Examiner* — David Chen
(74) *Attorney, Agent, or Firm* — Foley & Lardner LLP

(57) ABSTRACT

A method of producing a light-emitting device includes: providing a package having an upper surface and a recess including an opening located at the upper surface; disposing a light-emitting element on a surface defining a bottom of the recess of the package; disposing an uncured sealing member in the recess of the package; and curing the uncured sealing member while applying a centrifugal force to the package in which the uncured sealing member are disposed, such that the centrifugal force is applied in a direction perpendicular to the upper surface and toward the surface defining the bottom of the recess.

16 Claims, 13 Drawing Sheets

(51) Int. Cl.
*H01L 33/60* (2010.01)
*H01L 33/62* (2010.01)

(56) References Cited

U.S. PATENT DOCUMENTS

| | | | |
|---|---|---|---|
| 2011/0204400 A1* | 8/2011 | Koizumi | H05B 33/145 257/98 |
| 2012/0019123 A1* | 1/2012 | Furukawa | H01L 33/58 313/483 |
| 2012/0025243 A1* | 2/2012 | Lin | H01L 33/54 257/E33.072 |
| 2012/0119231 A1 | 5/2012 | Wang et al. | |
| 2013/0169149 A1 | 7/2013 | Sato et al. | |
| 2013/0300285 A1 | 11/2013 | Ito | |
| 2014/0048834 A1 | 2/2014 | Sato et al. | |
| 2015/0189703 A1 | 7/2015 | Akazawa | |
| 2015/0214442 A1* | 7/2015 | Chiang | H01L 33/508 438/27 |
| 2016/0097495 A1* | 4/2016 | Yamamoto | G02B 6/0073 349/65 |
| 2016/0111610 A1 | 4/2016 | Ota et al. | |
| 2017/0186927 A1* | 6/2017 | Naka | H01L 33/60 |
| 2017/0241611 A1 | 8/2017 | Pan et al. | |
| 2017/0279014 A1 | 9/2017 | Toyoda et al. | |
| 2018/0097161 A1 | 4/2018 | Sano | |
| 2018/0182933 A1 | 6/2018 | Abe et al. | |

FOREIGN PATENT DOCUMENTS

| | | | |
|---|---|---|---|
| JP | 2010-135763 A | | 6/2010 |
| JP | 2015-128092 A | | 7/2015 |
| JP | 2016-072412 A | | 5/2016 |
| JP | 2016-082212 A | | 5/2016 |
| JP | 2017-522722 A | | 8/2017 |
| JP | 2017-174908 A | | 9/2017 |
| JP | 2018-056497 A | | 4/2018 |
| JP | 2018-107354 A | | 7/2018 |
| JP | 2019-175985 A | | 10/2019 |
| KR | 101875344 B1 | * | 6/2018 |
| WO | WO-2012/029695 A1 | | 3/2012 |
| WO | WO-2012/099145 A1 | | 7/2012 |
| WO | WO-2012/147608 A1 | | 11/2012 |

* cited by examiner

METHOD OF MANUFACTURING LIGHT-EMITTING DEVICE INCLUDING STEP OF CURING SEALING MEMBER WHILE APPLYING CENTRIFUGAL FORCE

CROSS-REFERENCE TO RELATED APPLICATION

This application claims priority to Japanese Patent Application No. 2019-048979, filed on Mar. 15, 2019, the disclosure of which is hereby incorporated by reference in its entirety.

BACKGROUND

The present disclosure relates to light-emitting devices and methods of producing light-emitting devices.

Characteristics required for light-emitting devices include reduced unevenness in chromaticity. For example, PCT Publication No. WO 2012/099145 describes a light-emitting device that includes a plurality of light-emitting elements disposed on a substrate, a resin body covering each light-emitting element, and a light-diffusing member disposed on a surface of each resin body opposite to the light emission surface of the corresponding light-emitting element. In PCT Publication No. WO 2012/099145, diffusion of light is controlled by the light-diffusing member, and the distribution of light is controlled by controlling the shape of the resin body, so that unevenness in luminance and chromaticity of emitted light can be reduced.

While PCT Publication No. WO 2012/099145 is related to a light-emitting device mainly used for a backlight device, etc., it may also be desirable to reduce unevenness in chromaticity in a light-emitting device in which a light-emitting element is disposed in a recess of a package and the recess is sealed with a resin.

SUMMARY

Certain embodiments of the present disclosure allow for providing a light-emitting device that includes a light-emitting element in a recess of a package, and in which light distribution unevenness is reduced, and a method of producing the light-emitting device.

A method of producing a light-emitting device according to one embodiment of the present disclosure includes: providing a package having an upper surface, and a recess including an opening located at the upper surface; disposing a light-emitting element on a bottom surface of the recess of the package; disposing an uncured sealing member in the recess of the package; and curing the uncured sealing member while applying a centrifugal force to the package in which the uncured sealing member are disposed, such that the centrifugal force is applied in a direction perpendicular to the upper surface toward the bottom surface of the recess.

A light-emitting device according to one embodiment of the present disclosure includes a package having an upper surface and defining a recess including an opening in the upper surface, a light-emitting element disposed on a bottom surface of the recess of the package, and a sealing member disposed in the recess of the package and covering the light-emitting element. The upper surface of the sealing member includes a flat region. The flat region includes at least a region located above the light-emitting element. The flat region is located below the upper surface of the package.

According to certain embodiments of the present disclosure, provided are a light-emitting device in which a light-emitting element is disposed in a recess and unevenness in chromaticity of emitted light is reduced, and a method of producing the light-emitting device.

DETAILED DESCRIPTION

Figure 1A:
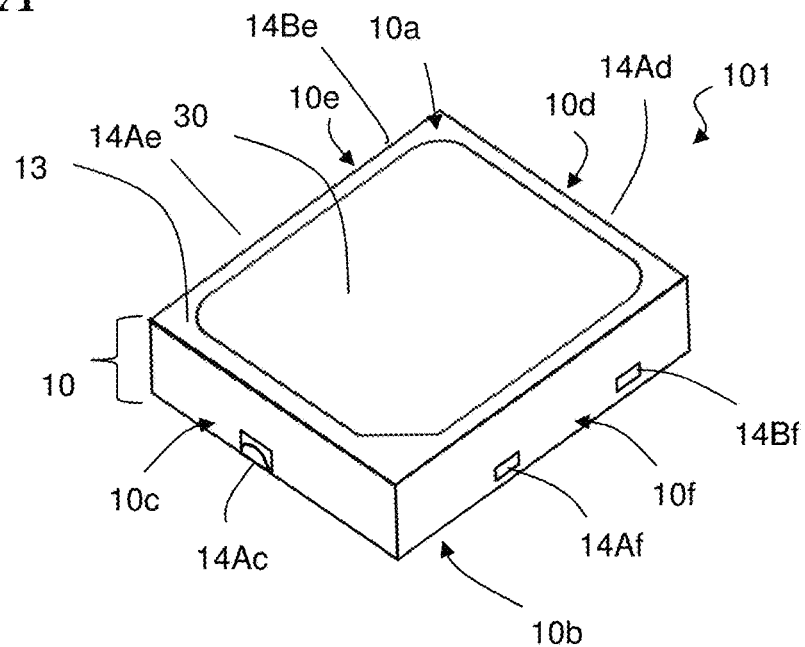
FIG. 1A is a schematic perspective view showing a light-emitting device produced using a method of producing a light-emitting device according to the present disclosure.

The inventors have extensively studied unevenness in chromaticity of emitted light that occurs in a light-emitting device in which a light-emitting element is disposed in a recess of a package, and the recess is sealed with a resin. As a result, the present inventors have found that the uneven chromaticity of light emitted from the light-emitting device is attributed to the shape of a surface of the sealing resin. The inventors have devised a light-emitting device having a novel structure and a method of producing the light-emitting device.

Certain embodiments of a method of producing a light-emitting device according to the present disclosure will now be described with reference to the accompanying drawings. The light-emitting device to be described below is merely illustrative, and various changes and modifications can be made thereto. The dimensions, shapes, etc., of elements shown in the drawings may be exaggerated for clarity. The dimensions, shapes, etc., of the elements of the light-emitting device and manufacturing device to be described below are not necessarily drawn to scale. For example, the dimensions of some of the elements of the light-emitting module relative to the other elements may be exaggerated. Some of the elements may not be shown, in order to avoid excessively complicating the drawings.

Structure of Light-Emitting Device

Figure 1B:
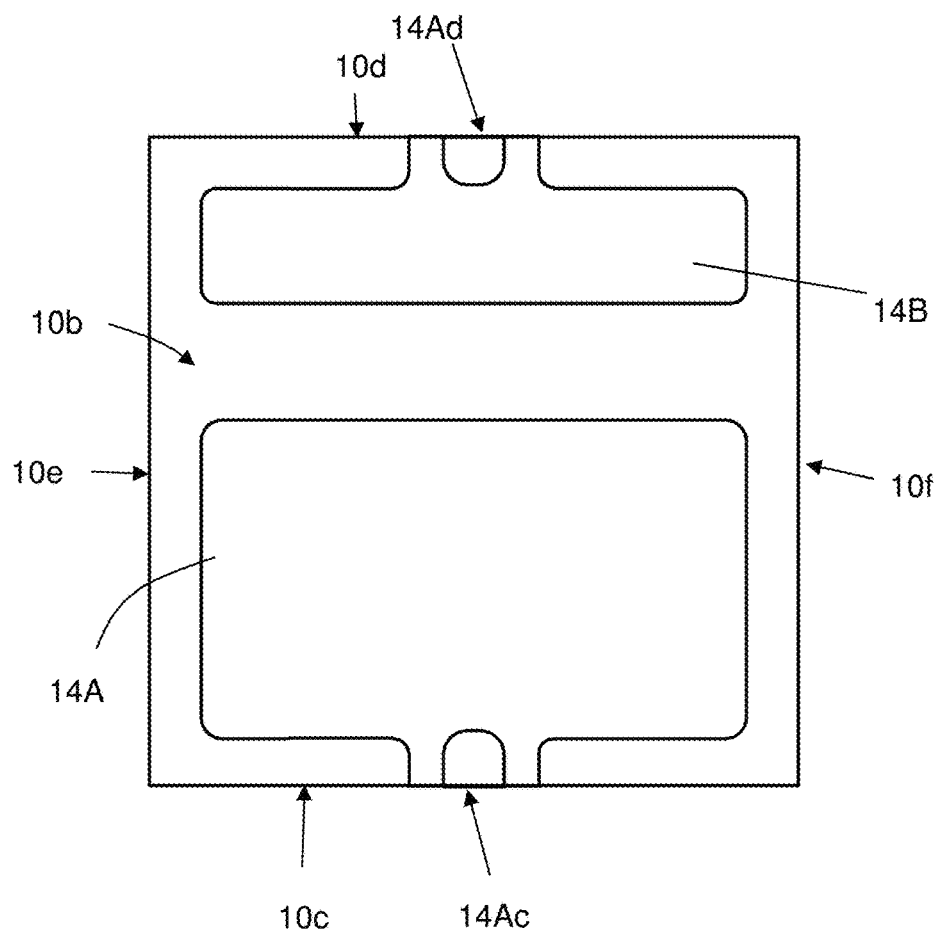
FIG. 1B is a schematic bottom view of the light-emitting device of FIG. 1A.
Figure 2A:
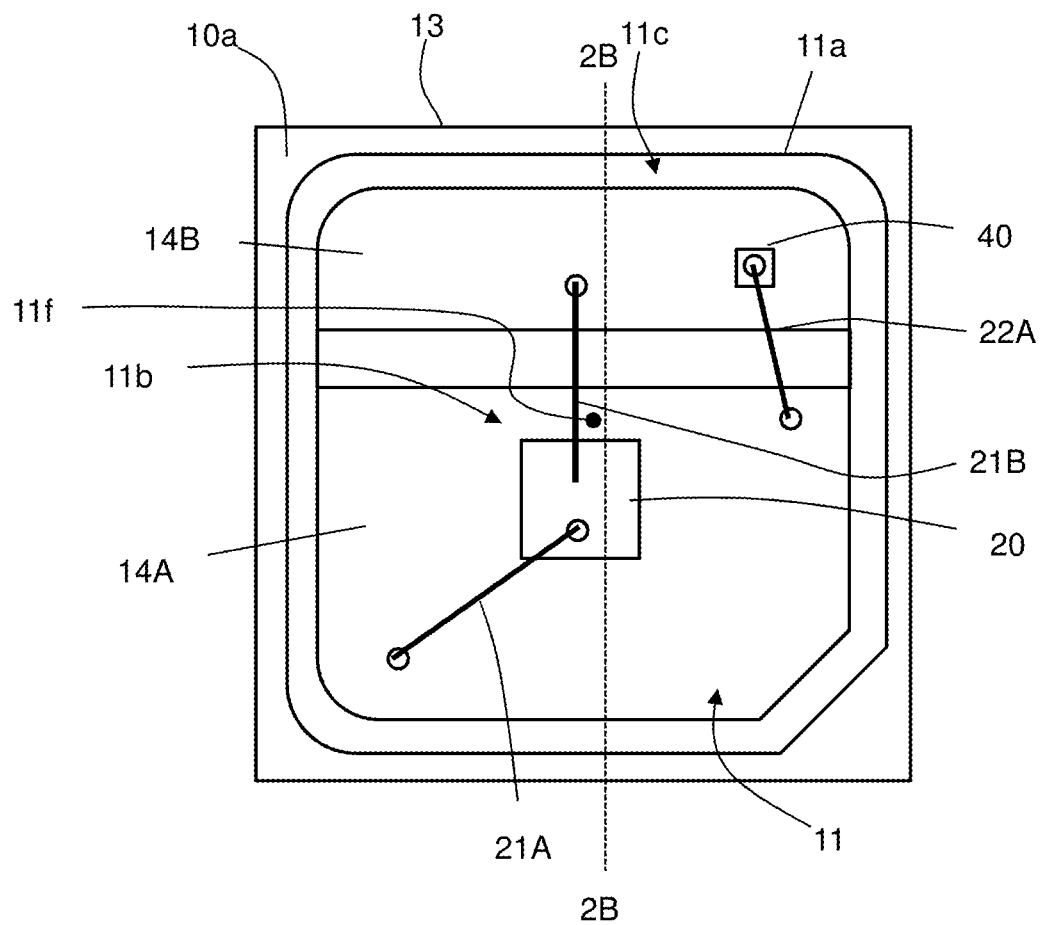
FIG. 2A is a schematic plan view of the light-emitting device of FIG. 1A in which illustration of a sealing member and light reflective member is omitted.
Figure 2B:
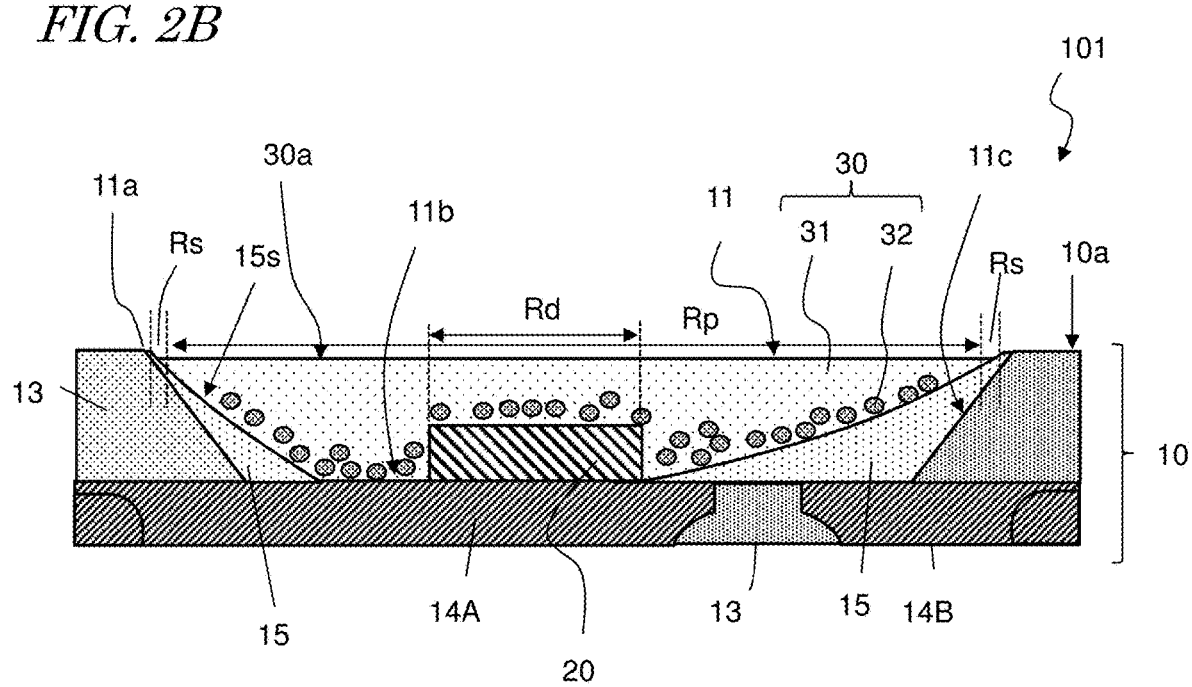
FIG. 2B is a schematic cross-sectional view of the light-emitting device taken along line 2B-2B of FIG. 2A.
Figure 2C:
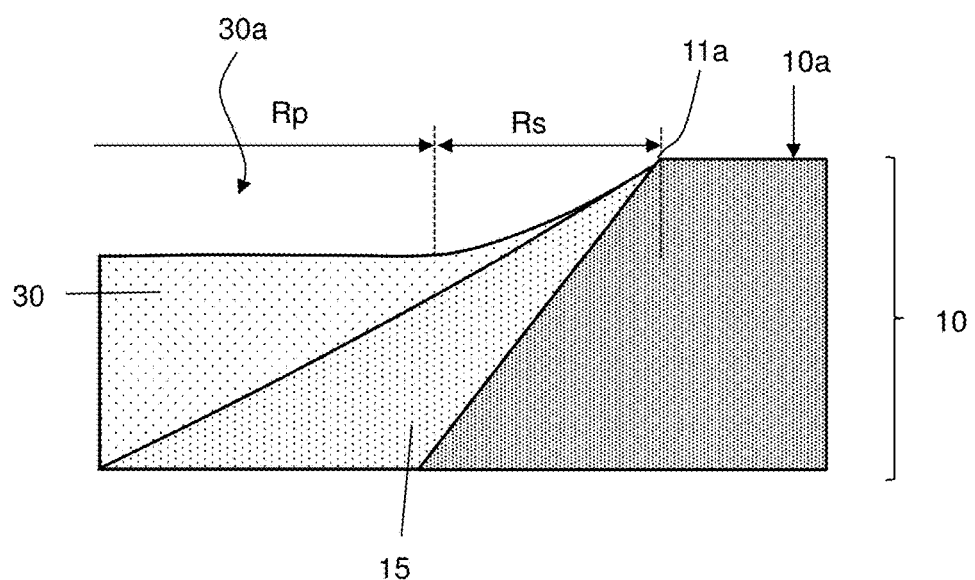
FIG. 2C is a schematic enlarged cross-sectional view of a portion at and near an end portion of the sealing member of FIG. 2B.

Embodiments of a light-emitting device according to the present disclosure will be described. FIG. 1A is a schematic perspective view showing one embodiment of the light-emitting device according to the present disclosure. FIG. 1B is a schematic bottom view of the light-emitting device of FIG. 1A. FIG. 2A is a schematic plan view of the light-emitting device of FIG. 1A in which illustration of a sealing member and light reflective member is omitted. FIG. 2B is a schematic cross-sectional view of the light-emitting device taken along line 2B-2B of FIG. 2A. FIG. 2C is an enlarged cross-sectional view of a portion of FIG. 2B. The light-emitting device 101 includes a package 10, a light-emitting element 20, and a sealing member 30. The light-emitting device 101 may further include a light reflective member 15 and a protective element 40.

Package 10

The package 10 serves as a housing that houses the light-emitting element 20. The package 10 has an upper surface 10a and a lower surface 10b, and defines a recess 11 having an opening 11a located in the upper surface 10a. In this embodiment, the upper surface 10a has an outer periphery having a substantially rectangular shape, and the package 10 has four lateral surfaces 10c-10f corresponding to the four sides of the rectangular shape of the upper surface 10a.

In this embodiment, the package 10 includes an insulating base body 13 and lead terminals 14A and 14B. The base body 13 includes a portion of a surface 11b defining a bottom of the recess 11, and an inner lateral surface 11c defining the recess 11. The upper surface 10a of the package 10 may be provided with a protrusion or recess, a groove surrounding the opening 11a, etc. A portion of each of the lead terminals 14A and 14B is exposed from the surface 11b defining the bottom of the recess 11.

The base body 13 is formed of an insulating material. The base body 13 is also preferably formed of a material that does not easily transmit light from the light-emitting element 20 and external light. The base body 13 is a main part that maintains the structure of the package 10, and therefore, preferably has a predetermined strength. The base body 13 is formed of, for example, a thermosetting resin, thermoplastic resin, ceramic, or the like. More specifically, the base body 13 is formed of a resin material, such as an epoxy resin, silicone resin, phenolic resin, glass epoxy resin, BT resin, or PPA, or a ceramic material, such as alumina or aluminum nitride. Alternatively, the base body 13 may be formed of a material that reflects light from the light-emitting element 20 on the inner lateral surface 11c defining the recess 11. In other words, the inner lateral surface 11c may be formed of another member that has a higher reflectance to light emitted by the light-emitting element 20 than that of a material of the outer surface of the base body 13. This allows for improving the light extraction efficiency of the light-emitting device 101.

The lead terminals 14A and 14B serve as a terminal for electrically connecting the light-emitting element 20 to a wiring external to the package 10. The package 10 includes at least one pair of lead terminals 14A and 14B. A portion of each of the lead terminals 14A and 14B is exposed from the outer surface of the package 10, and another portion of each of the lead terminals 14A and 14B is embedded in the base body 13. In this embodiment, the lead terminal 14A has end surfaces 14Ac, 14Ae, and 14Af that are exposed from the lateral surfaces 10c, 10e, and 10f of the package 10, respectively. The lead terminal 14B has end surfaces 14Bd, 14Be, and 14Bf that are exposed from the lateral surfaces 10d, 10e, and 10f of the package 10, respectively. As described below, during production of the light-emitting device 101, the package 10 is formed from a lead frame having a resin in which a plurality of packages 10 are integrally formed. The lateral surfaces 10c, 10d, 10e, and 10f of the package 10 and the end surfaces 14Ac, 14Bd, 14Ae, and 14Af exposed from the lateral surfaces 10c, 10d, 10e, and 10f of the package 10, respectively, are formed by cutting the lead frame with a resin. Employing such a lead frame in which a plurality of packages are joined together allows for simultaneously manufacturing a plurality of light-emitting devices.

As described above, each of the lead terminals 14A and 14B has a shape, for example, such that one of the two main opposite surfaces of each lead terminal is partially exposed from the surface 11b defining the bottom of the recess 11, and the other main surface is partially exposed from the lower surface 10b of the package 10. The package 10 may be provided with an electrode or interconnect formed on a surface of the base body 13, instead of the lead terminals 14A and 14B.

For the lead terminals 14A and 14B a material having a relatively high thermal conductivity is preferably used. Using such a material for the lead terminal allows for efficiently transferring and dissipating heat generated in the light-emitting element 20 to the outside of the package 10. For example, a material having a thermal conductivity of about 200 W/(m·K) or more is preferably used. Furthermore, a material having a relatively high mechanical strength is preferably used. Examples of the lead terminal include a metal plate of aluminum, iron, nickel, copper, an alloy thereof or the like that has been processed to have a desired shape by pressing such as punching or the like, etching, or the like. Furthermore, a surface of the lead terminals 14A and 14B is preferably coated with a metal film. For the metal film, for example, Ag, an Ag alloy, Au, an Au alloy, or the like can be preferably used. In addition, a layer containing Ni is preferably disposed to serve as an underlying layer for the metal film. Examples of the underlying layer include a layered structure containing Ni/Pd, Ni/Au, Ni/Pd/Au, or the like. The metal film may be formed by, for example, a plating. With the lead terminal having such a metal film can be more easily joined to the light reflective member 15 and/or a conductive wire to be described below or the like. The lead terminal has a thickness of, for example, in a range of 110 to 250 μm. The lead terminal may have different thicknesses at different portions due to the processing described above or the like. In the case in which a plating is formed on a surface of the lead terminal, the plating may have different thicknesses or different layer structures at different portions.

Light Reflective Member 15

The light-emitting device 101 may include the light reflective member 15. The light reflective member 15 reflects light emitted from the light-emitting element 20 toward the opening 11a. The light reflective member 15 is disposed in the recess 11, covering the inner lateral surface 11c defining the recess 11 and at least a portion of the surface 11b. The light reflective member 15 is preferably spaced apart from the lateral surface of the light-emitting element 20 so as not to hinder extraction of light from the lateral surface of the light-emitting element 20.

The light reflective member 15 has a sloped surface 15s. The sloped surface 15s has a height gradually reduced from the inner lateral surface 11c defining the recess 11 toward the light-emitting element 20. As a result, the sloped surface 15s has a curved surface that is convex toward the inner surface 11c and the surface 11b defining the bottom of the recess 11. This allows the light reflective member 15 to reflect light emitted from the light-emitting element 20 toward the opening 11a, and therefore, the external extraction efficiency of the light-emitting device 101 can be increased.

For the light reflective member 15, a member that does not easily transmit or absorb light from the light-emitting element 20 or external light, etc is preferably used. The light reflective member 15 preferably has a white color. Examples of a resin serving as a base material for the light reflective member 15 include a thermosetting resin, thermoplastic resin, and the like. More specifically, a phenolic resin, epoxy resin, BT resin, PPA, silicone resin, etc., can be used. When light-scattering particles of a light reflective substance that does not easily absorb light from the light-emitting element and has a refractive index very different from that of the resin as the base material (e.g., titanium oxide, zinc oxide, silicon oxide, zirconium oxide, aluminum oxide, or aluminum nitride) are dispersed in these resins serving as the base material, light can be efficiently reflected. The viscosity of the light reflective member 15 in the uncured state is preferably lower than the viscosity of the sealing member 30 in the uncured state. For example, the viscosity of the light reflective member 15 in the uncured state is preferably in a range of 1 to 20 pa·s, more preferably 5 to 15 pa·s. This allows for facilitating wet-spread of the light reflective member 15 in the recess 11, and allows for reducing possibility that the amount of the light reflective member 15 provided in the recess 11 is insufficient. The light reflective member 15 in the uncured state preferably has high thixotropy. The light reflective member 15 preferably has a light reflectance higher than that of the base body 13.

Light-Emitting Element 20

The light-emitting element 20 is a semiconductor light-emitting element, such as a semiconductor laser or light-emitting diode. The light-emitting element 20 may have any appropriate emission wavelength. For example, for a blue or green light-emitting element, a light-emitting element employing ZnSe or a nitride semiconductor ($In_XAl_YGa_{1-X-Y}N$, $0 \leq X$, $0 \leq Y$, and $X+Y \leq 1$) can be used. For a red light-emitting element, a GaAs, AlInGaP, or AlGaAs semiconductor, etc., can be used. In addition, a semiconductor light-emitting element formed of other materials can be used. The composition, emission color, size, number, etc., of a light-emitting element(s) used can be appropriately selected according to the purpose. Not only a light-emitting element configured to emit visible light but also a light emitting element configured to emit ultraviolet or infrared light can be used.

As described below, the sealing member 30 may include a wavelength conversion member. When the sealing member 30 includes a wavelength conversion member, an entirety or a portion of light emitted from the light-emitting element 20 can be converted into light in another wavelength band. In that case, the light-emitting device 101 emits a mixture of light emitted from the light-emitting element 20 and light emitted from the wavelength conversion member, or alternatively, only light emitted from the wavelength conversion member. For example, when the light-emitting element 20 emits blue light, and the wavelength conversion member converts blue light into yellow light, the light-emitting device 101 can be configured to emit white light in which blue light emitted from the light-emitting element 20 and yellow light emitted from the wavelength conversion member is mixed. Alternatively, for example, when the light-emitting element 20 emits blue light, and the wavelength conversion member converts blue light into red light or pale yellow light, causing light emitted from the wavelength conversion member to be emitted from the light-emitting device 101 allows the light-emitting device 101 to emit red light or pale yellow light. In this embodiment, the light-emitting device 101 includes a single light-emitting element. Alternatively, the light-emitting device 101 may include a plurality of light-emitting elements. In the case in which the light-emitting device 101 includes a plurality of light-emitting elements, the plurality of light-emitting elements may emit similar colors or different colors. For example, the light-emitting device 101 may include three light-emitting elements that emit red light, blue light, and green light, which allows the light-emitting device 101 to emit full-color light.

In this embodiment, the light-emitting element 20 is disposed on the lead terminal 14A exposed from the surface 11b defining the bottom of the recess 11. The at least one pair of positive and negative electrodes of the light-emitting element 20 are electrically connected to the lead terminals 14A and 14B exposed from the surface 11b defining the bottom of the recess 11 through conductive wires 21A and 21B, respectively. In the light-emitting device 101 of this embodiment, the light-emitting element 20 is offset from a center 11f of the surface 11b defining the bottom of the recess 11 and is located closer to the inner surface in a plan view. In other words, the center of the light-emitting element 20 does not coincide with the center 11f of the surface 11b defining the bottom of the recess 11. With the light-emitting element 20 located closer to the inner lateral surface than the center 11f of the surface 11b defining the bottom of the recess 11, while the size of the light-emitting device 101 can be reduced, a connecting area of a wire-bond connecting the light-emitting element 20 and the lead terminal, and a mount area of electronic components, such as a protective element, can be ensured.

Protective Element 40

The light-emitting device 101 may include, in addition to the light-emitting element 20, electronic components, such as a protective element. In this embodiment, the light-emitting device 101 includes a protective element 40. Examples of the protective element 40 include a Zener diode, which prevents breakage of the light-emitting element 20 due to static electricity, etc.

The protective element 40 has an electrode on each of the upper and lower surfaces of the protective element 40, and the lower surface is electrically connected to a corresponding one of the lead terminal 14A and 14B through a conductive bonding member, such as solder, so that the electrode on the lower surface is electrically coupled to the corresponding one of the lead terminal 14A or 14B. In this embodiment, the protective element 40 is disposed on the lead terminal 14B exposed at the surface 11b defining the bottom of the recess 11, and the electrode on the lower surface thereof is electrically connected to the lead terminal 14B. The electrode on the upper surface of the protective element 40 is electrically connected to the lead terminal 14A through a conductive wire 22A. By such wiring, the light-emitting element 20 and the protective element 40 are connected together in parallel.

Sealing Member 30

The sealing member 30 is disposed in the recess 11 to protect the light-emitting element 20, the conductive wires 21A, 21B, and 22A, the protective element 40, etc., from moisture, external force, and dust. The sealing member 30 is disposed in the recess 11, and covers the light-emitting element 20, the protective element 40, and the conductive wires 21A, 21B, and 22A in the recess 11. The sealing member 30 is not disposed on the upper surface 10a of the package 10.

The sealing member 30 has an upper surface 30a, which is a boundary between the light emission surface of the light-emitting device 101 and the outside. The upper surface 30a has a flat region Rp, and a sloped region Rs, which is continuous to the flat region Rp and extends to an end portion of the opening of the recess 11 of the package 10. The flat region Rp includes a region Rd located above the light-emitting element 20 and including a region directly above the light-emitting element 20. The entirety of the flat region Rp is substantially parallel to a reference surface of the package 10. As used herein, the expression "substantially parallel" refers to a case in which an angle with respect to a surface of the package 10 that serves as a reference surface for parallel configuration is in the range of ±3°. The "reference surface of the package 10" refers to, for example, the upper surface 10a, the surface 11b, etc.

The sloped region Rs surrounds the flat region Rp, and is continuous to the flat region Rp. The sloped region Rs extends to the end portion of the opening 11a located in the upper surface 10a of the package 10. In other words, the sloped region Rs is located between the flat region Rp and the end portion of the opening 11a, and the sloped region Rs surrounds the flat region Rp, and the end portion of the opening 11a surrounds the sloped region Rs. The sloped region Rs is a portion of the upper surface 10a that is sloped at an angle of more than ±3° with respect to a horizontal reference surface of the package 10.

The size of the flat region Rp is preferably 80% or more of the area of the entirety of the upper surface 30a of the sealing member 30 in a plan view. The size of the flat region Rp is more preferably 85% or more, even more preferably 90% or more, of the area of the entirety of the upper surface 30a. Meanwhile, the upper limit of the size of the flat region Rp is not particularly limited. For example, the flat region Rp may occupy the entire upper surface 30a. However, as described below, it is not preferable for an uncured sealing member to overflow from the recess 11 during manufacturing of the light-emitting device 101. Therefore, in order that the upper surface of an uncured sealing member disposed in the recess 11 is located lower than the upper surface 10a of the package 10, the amount of the uncured sealing member disposed in the recess 11 is set to be smaller than the capacity of the recess 11. This allows the flat region Rp of the upper surface 30a of the sealing member 30 to be located below the upper surface 10a of the package 10, resulting in generation of the sloped region Rs surrounding the flat region Rp. The sloped region Rs surrounding the flat region Rp has a width in a range of, for example, 0.01 to 0.60 mm in a plan view. Considering the physical properties of a sealing member used and the upper surface area and mount position of the light-emitting element 20, the size of the flat region Rp is determined so that at least the upper surface of the light-emitting element 20 is located directly below the flat region Rp.

As described in detail below, in conventional light-emitting devices, almost no flat region is formed in the upper surface of the sealing member, or the proportion of the flat region to the upper surface is small. According to the light-emitting device of the present disclosure, a large flat region Rp can be formed in the upper surface 30a by curing the sealing member 30 while applying a centrifugal force. With the sealing member 30 including the above flat region Rp in the upper surface 30a, it is possible to reduce the occurrence of unevenness in chromaticity of emitted light, e.g., unevenness in emission color between a region at and near the center and a region at and near the outer periphery of light emitted from the light-emitting device 101 in the case in which the sealing member 30 includes a wavelength conversion member. Reduction in unevenness in chromaticity of emitted light allows for reducing the amount of the light reflective member that is added to the sealing member 30 in order to mix the colors of light, compared to when a great unevenness in chromaticity of emitted light occurs (e.g., the case in which the sealing member 30 does not include the flat region Rp), resulting in increase in light extraction efficiency.

The sealing member 30 is preferably light-transmissive to light emitted from the light-emitting element 20. More specifically, the sealing member 30 preferably contains a silicone resin as the base material 31. Examples of the silicone resin include dimethyl silicone resins, methyl phenylsilicone resins, and phenylsilicone resins. Silicone resins has good resistance to heat and light, and therefore, are preferably used for the base material 31 of the sealing member 30. Alternatively, an epoxy resin may be used for the base material 31. While epoxy resins are generally known as resins having a relatively great reduction in volume when cured, curing the epoxy resin while applying a centrifugal force thereto allows for obtaining the sealing member 30 having a flat upper surface 30a.

The sealing member 30 may contain a filler in addition to the base material 31. In this embodiment, the sealing member 30 may contain a wavelength conversion member 32 that serves as a filler. Examples of the wavelength conversion member 32 include a phosphor, quantum dot, or the like. For the phosphor, a known phosphor can be employed. Examples of the phosphor include yttrium aluminum garnet (YAG) activated by cerium, lutetium aluminum garnet (LAG) activated by cerium, and nitrogen-containing aluminosilicate calcium (CASN) activated by europium and/or chromium. For the phosphor, a combination of a plurality of kinds of phosphors may be employed. For example, a combination of phosphors having different emission colors that is suitable for a desired color, or a mixture of phosphors having different emission colors at a mixing ratio suitable for a desired color, can be used to adjust color rendering or color reproducibility.

As described above, in the light-emitting device 101 according to the present disclosure, the upper surface of the sealing member includes a large flat region, resulting in reduction of luminance unevenness and unevenness in chromaticity of light emitted from the light-emitting device 101, which is one object of the present disclosure. Accordingly, the amount of a light reflective member added in order to reduce unevenness in luminance and unevenness in chromaticity of emitted light can be reduced compared to the amount of a light reflective member added in order to reduce unevenness in luminance and unevenness in chromaticity of light emitted from a light-emitting device that does not have a large flat region, resulting in an improvement in light extraction efficiency of a light-emitting device.

The sealing member 30 may contain a light reflective member serving as a filler. Examples of the light reflective member include silicon oxide (silica), titanium oxide, magnesium oxide, zirconium oxide, titanate barium, and aluminum oxide. When the light reflective member is irradiated with light emitted from the light-emitting element 20 or light emitted from the wavelength conversion member 32, the light reflective member reflects the light in random directions, and therefore, the unevenness in luminance, unevenness in emission color, etc., of light emitted from the light-emitting device 101 can be further reduced.

The sealing member 30 may contain, as a filler, a light absorbing substance to the extent that light-transmissiveness of the sealing member 30 is not impaired. The light absorbing substance may be a black pigment, such as carbon black or graphite. With such a filler dispersed in the sealing member 30, the unevenness in emission color of the light-emitting device 101 can be reduced, and the decrease of display contrast of the light-emitting device 101 can be reduced, for example.

The sealing member 30 may not contain any one of the fillers described above, or may contain one or more of the fillers described above. In the case in which the particles of the filler are spherical, the filler particles easily sediment in the base material 31 in the uncured state. Therefore, light emitted from the light-emitting element 20 is likely to be emitted to the outside without being scattered at or near the upper surface 30a of the sealing member 30. Therefore, the efficiency of extraction of light from the sealing member 30 can be improved.

The fluorescent characteristics of the phosphor used for the wavelength conversion member 32 may decrease due to moisture in an external environment, etc., depending on compositions of constituent elements of the phosphor. In the case in which the sealing member 30 contains a phosphor having such characteristics, in the sealing member 30, the phosphor can be predominantly distributed at the surface 11b side of the recess 11 utilizing a centrifugal force as described below. Accordingly, the phosphor can be disposed further inward away from the upper surface 30a of the sealing member 30, which is a boundary with an external environment, to the extent possible. Therefore, the degradation of the phosphor due to moisture in an external environment can be reduced.

Meanwhile, in the case in which the filler particle has a crushed form, the filler particle has a surface area larger than that of a spherical particle having a similar size. Therefore, the sedimentation of such filler particles in the base material 31 in the uncured state is reduced even in the state in which centrifugal force is applied. In particular, in the case in which the filler particle has a small particle size, the filler particle is less affected by a centrifugal force. Accordingly, the filler can be located closer to the upper surface 30a of the sealing member 30.

Therefore, when the sealing member 30 contains a plurality of kinds of fillers, utilizing difference in shape of particles, one filler can be uniformly distributed in the sealing member 30 while another filler can be distributed predominantly at the surface 11b side of the recess 11, even in the state where a centrifugal force is applied.

Light Emission of Light-Emitting Device 101

Configuration that allows reduction in unevenness in chromaticity of light emitted from the light-emitting device 101 will be described below. As described above, in the light-emitting device 101, the upper surface 30a of the sealing member 30 includes the large flat region Rp. The sealing member 30 having such a structure is formed utilizing a centrifugal force.

Figure 3A:
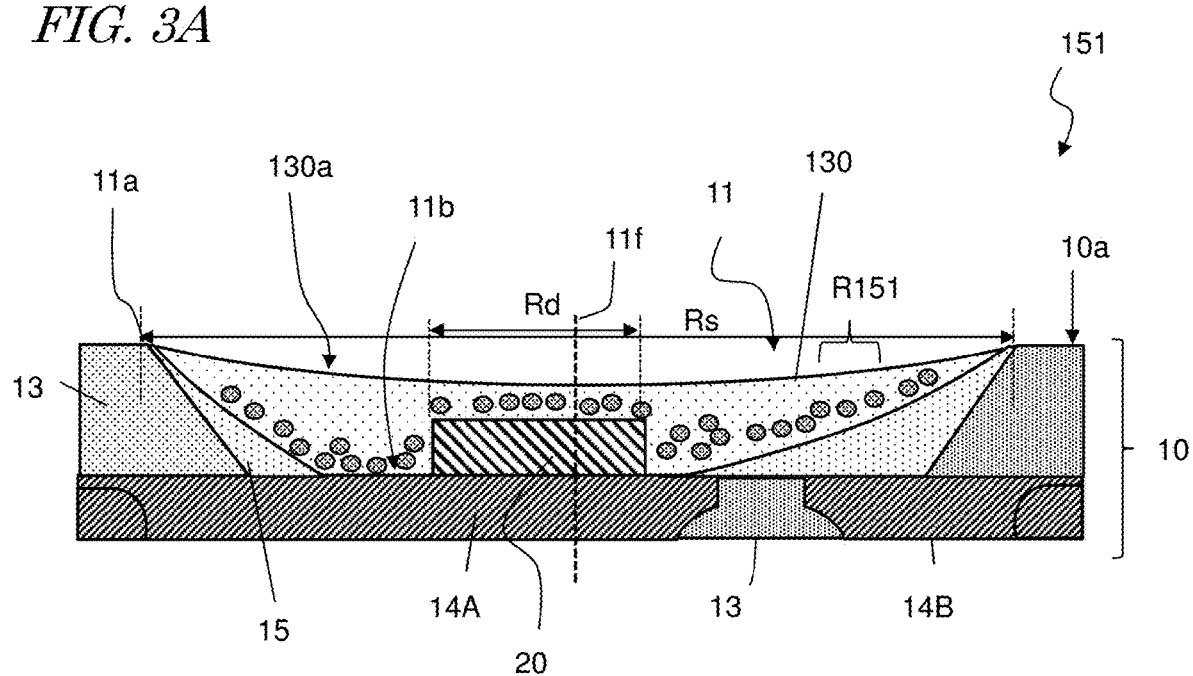
FIG. 3A is a schematic cross-sectional view of a conventional light-emitting device.
Figure 3B:
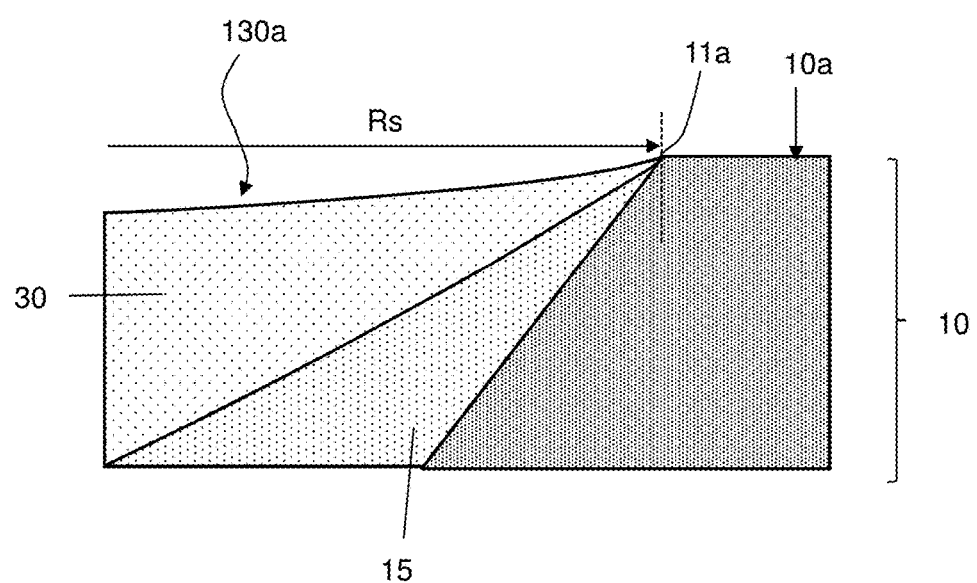
FIG. 3B is a schematic enlarged view of a portion at and near an end portion of a sealing member of FIG. 3A.

FIG. 3A schematically shows a cross-sectional structure of a conventional light-emitting device 151. FIG. 3B is an enlarged view of a portion of the structure of FIG. 3A. When a sealing member 130 is formed in a recess 11 of a package 10 in the conventional light-emitting device 151, an uncured sealing member is disposed in the recess 11 by potting or the like, and thermal treatment or the like is performed to cure the uncured sealing member, so that the sealing member 130 is obtained. At this time, the volume of the sealing member 130 decreases (which may also be referred to as shrinkage of the sealing member 130) due to the thermal curing of the uncured sealing member. Accordingly, the upper surface 130a of the cured sealing member 130 has a height smallest at the center 11f of the recess 11 of the light-emitting device 151 in a plan view, and forms, as a whole, a sloped region having an angle that is gradually increased in an outward direction from the center 11f. Therefore, in the conventional light-emitting device 151, almost no flat region is formed in the upper surface 130a of the sealing member 130.

Figure 3C:
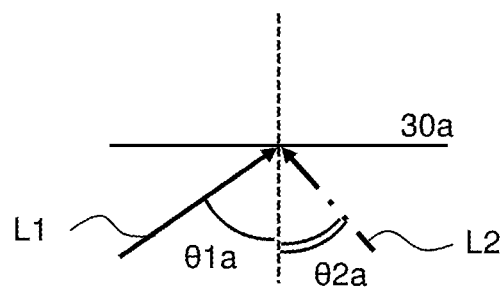
FIG. 3C is a schematic diagram for describing the incidence of light to an upper surface of a sealing member of a light-emitting device according to an embodiment.
Figure 3D:
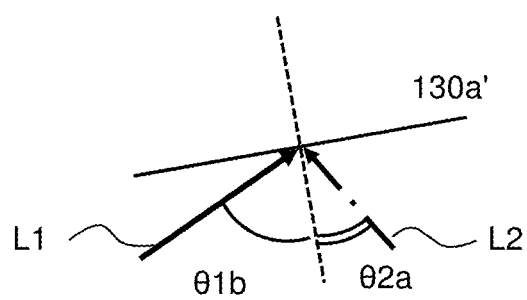
FIG. 3D is a schematic diagram for describing the incidence of light to an upper surface of a sealing member of a conventional light-emitting device.

FIG. 3C is a schematic diagram for describing light emitted from a portion of the flat region Rp of the upper surface 30a of the sealing member 30 in the light-emitting device 101, the portion located at a peripheral side with respect to a portion directly above the light-emitting element 20. FIG. 3D is a schematic diagram for describing light emitted from a region R151 of the sloped region Rs of the upper surface 130a of the sealing member 130 in the conventional light-emitting device 151, the region R151 located at a peripheral side with respect to a portion located directly above the light-emitting element 20. In the light-emitting device 101, the upper surface 30a in the flat region Rp is parallel to the surface 11b defining the bottom of the recess 11. In contrast to this, in the conventional light-emitting device 151, the upper surface 130a has a slope with a height smallest at the center 11f and gradually increased toward the periphery of the upper surface 130a.

For each of the upper surfaces 30a and 130a, light L1 that is emitted directly from the light-emitting element 20 and light L2 that travels in the recess 11 and reflected at the sloped surface of the light reflective member 15 to travel toward the upper surface 30a, 130a will be discussed below. The angles of incidence of the light L1 and L2 entering the upper surface 30a with reference to a line (indicated by a dashed line) perpendicular to the upper surface 30a, are represented by $\theta 1a$ and $\theta 1b$, respectively. The angles of incidence of the light L1 and L2 entering the upper surface 130a with reference to a line (indicated by a dashed line) perpendicular to the upper surface 130a, are represented by $\theta 2a$ and $\theta 2b$, respectively.

In FIGS. 3C and 3D, light L1 travels in a direction at the same angle. Likewise, in FIGS. 3C and 3D, light L2 travels in a direction at the same angle. In this case, due to slope of the upper surface 130a, θ1a<θ1b and θ2a>θ2b are satisfied. In other words, incident angle of light L1 is greater in the conventional light-emitting device 151, and therefore, total internal reflection is more likely to occur in the conventional light-emitting device 151. Therefore, light L1 is relatively more easily emitted from the light-emitting device 101, and is relatively less easily emitted from the light-emitting device 151. Meanwhile, incident angle of light L2 is greater in the light-emitting device 101 according to one embodiment of the present disclosure, and therefore, total internal reflection is more likely to occur in the light-emitting device 101 according to one embodiment of the present disclosure. Therefore, light L2 is relatively less easily emitted from the light-emitting device 101, and is relatively more easily emitted from the light-emitting device 151.

TABLE 1

|  | Light L1 | Light L2 |
| --- | --- | --- |
| Light-emitting device 101 | More easily emitted | Less easily emitted |
| Conventional light-emitting device 151 | Less easily emitted | More easily emitted |

A case is considered in which the light-emitting element 20 emits blue light and the sealing members 30 and 130 contain a yellow phosphor in the light-emitting device 101 and the conventional light-emitting device 151, causing emission of white light from the light-emitting devices 101 and 151 in the light-emitting device 101 and the conventional light-emitting device 151. In this case, light L1 is mainly blue light, and light L2 is transmitted in the sealing members 30 and 130, and accordingly contains a greater amount of yellow light excited by the phosphor. Therefore, it is considered that, in the conventional light-emitting device 151, light L2 is relatively more easily emitted, and therefore, chromaticity deviation occurs particularly at a periphery of the upper surface 130a where the upper surface 130a is more sloped, so that yellow light is noticeable at a peripheral portion with respect to the optical axis of light emitted from the light-emitting device 151.

In contrast to this, in the light-emitting device 101, light L2 is less likely to be emitted, and therefore, chromaticity deviation toward yellow can be reduced. In addition, the area of the sloped region of the upper surface 30a is small, and therefore, the region where chromaticity deviation occurs can be reduced. Therefore, according to the present disclosure, a light-emitting device with reduction in unevenness in emission color can be obtained.

Further, controlling the shape of the upper surface 30a of the sealing member 30 allows for reducing unevenness in emission color. Therefore, the amount of a light reflective member that is added to the sealing member in order to reduce unevenness in emission color can be reduced, or the sealing member 30 that does not contain a light reflective member can be used. Accordingly, the amount of light emitted from the sealing member 30 can be increased. In addition, the fluidity of the uncured sealing member can be increased by reducing the amount of a light reflective member, so that the uncured sealing member can be more easily disposed in the recess 11.

Thus, in the light-emitting device 101, the upper surface 30a of the sealing member 30 has a substantially flat region including at least a region directly above the light-emitting element. Therefore, in at least a region directly above the light-emitting element, light traveling toward outside of the sealing member 30 at the same angle is incident on the interface between the upper surface 30a and the outside at the same incident angle, irrespective of a location at which light is emitted out of the sealing member 30, and therefore, deviation in chromaticity of emitted light can be reduced. Such an optical relationship is maintained, particularly even when the light-emitting element 20 is located offset from the center of the recess 11. Therefore, even in a light-emitting device in which the light-emitting element is not disposed at the center thereof, deviation in chromaticity can be reduced.

The greater such a flat region of the upper surface of the sealing member, the greater the light distribution angle that allows for reducing unevenness in chromaticity of emitted light, and accordingly, the more greatly unevenness in chromaticity of a light-emitting device can be reduced.

Method of Producing Light-Emitting Device

Figure 4:
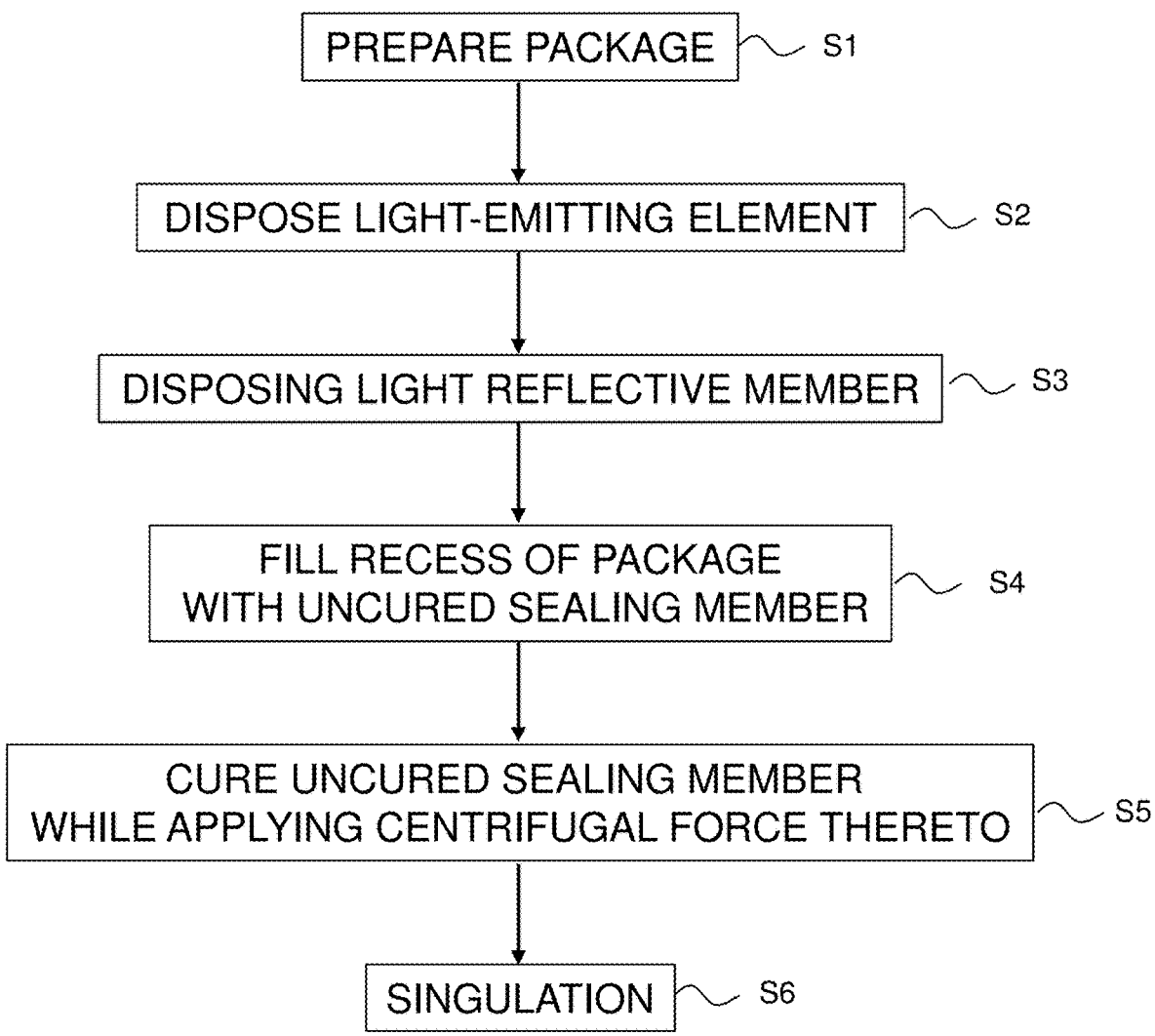
FIG. 4 is a flowchart showing production steps in a method of producing the light-emitting device of the present disclosure.

Next, a method of producing the light-emitting device 101 will be described. FIG. 4 is a flowchart showing production steps in the method of producing the light-emitting device of the present disclosure. FIGS. 5A-5E and 6A are schematic cross-sectional views for describing steps of the method of producing the light-emitting device. FIGS. 6B-6D are schematic plan views for describing the method of producing the light-emitting device.

The method of producing the light-emitting device of the present disclosure includes (A) a step of preparing a package, (B) a step of disposing a light-emitting element in the package, (D) a step of filling the package with an uncured sealing member, and (E) curing the uncured sealing member while applying a centrifugal force. In the case in which the light-emitting device 101 includes the light reflective member 15, the method of producing the light-emitting device of the present disclosure includes, between the steps (B) and (D), (C) a step of forming the light reflective member 15. These steps will now be described in detail.

(A): Providing Package (S1)

Figure 5A:
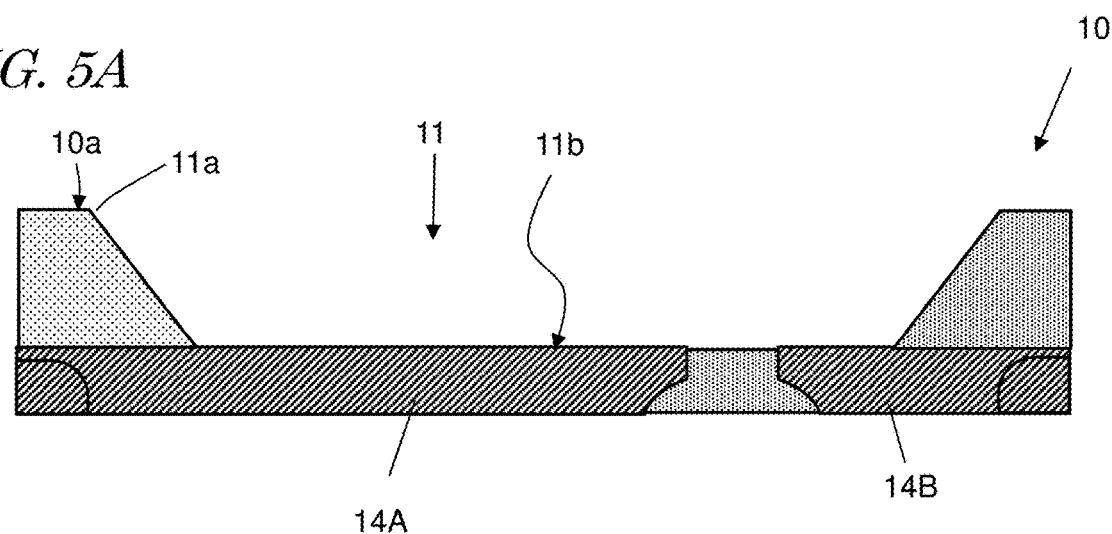
FIG. 5A is a schematic cross-sectional view for describing a step of preparing a package in the method of producing the light-emitting device.
Figure 6A:
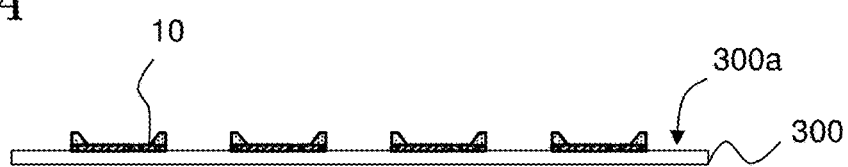
FIG. 6A is another cross-sectional view for describing a step of preparing a package in the method of producing the light-emitting device.
Figure 6B:
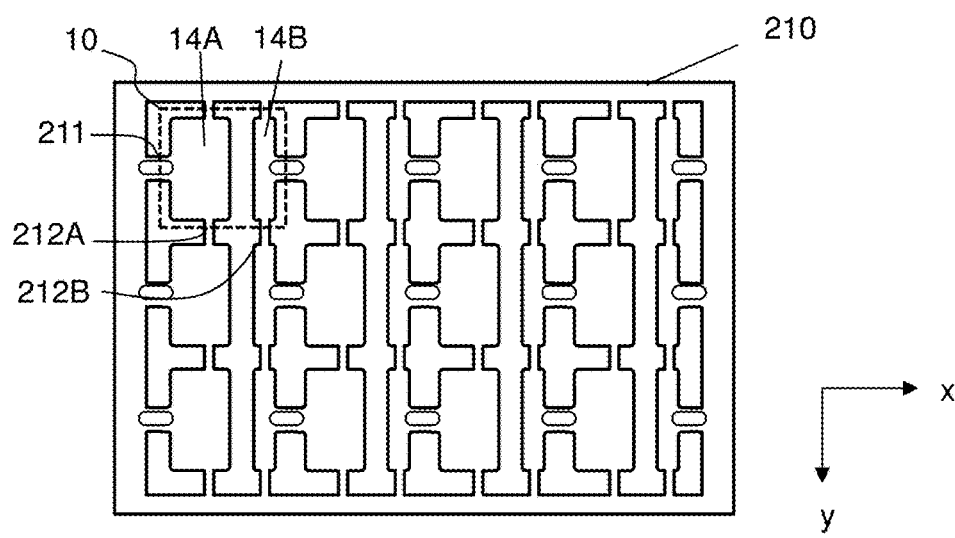
FIG. 6B is a schematic plan view of a lead frame used in the step of preparing a package in the method of producing the light-emitting device.
Figure 6C:
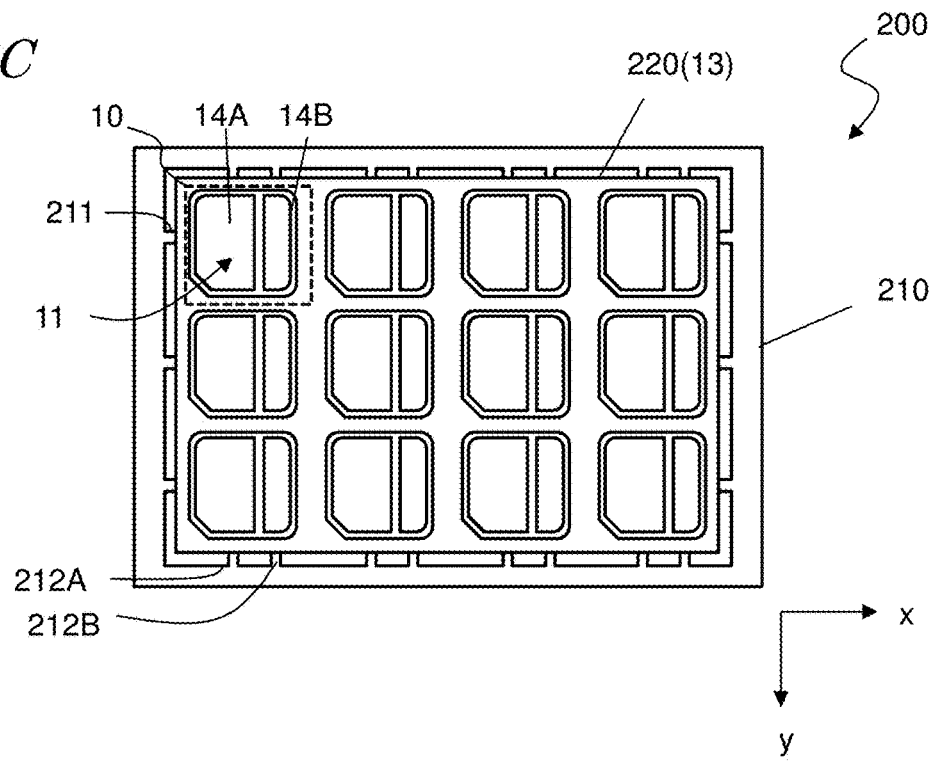
FIG. 6C is a schematic plan view of a lead frame having a resin used in the step of preparing a package in the method of producing the light-emitting device.
Figure 6D:
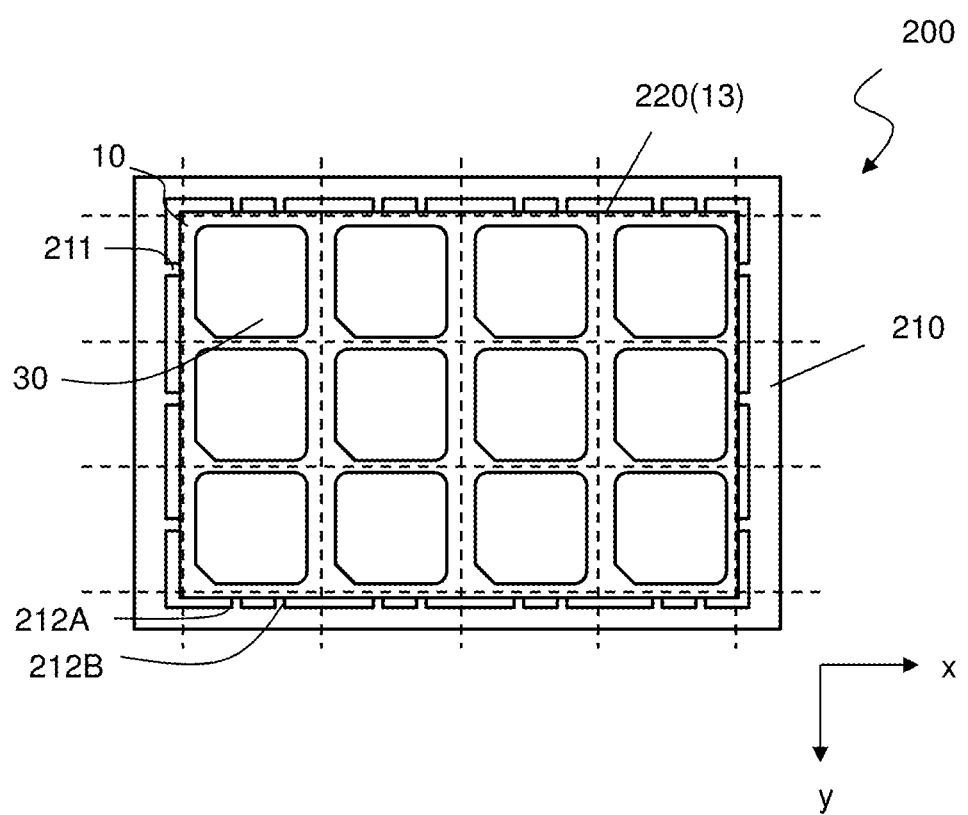
FIG. 6D is a schematic plan view of a lead frame having a resin used in a step of separating into individual packages in the method of producing the light-emitting device.

As shown in FIG. 5A, a package 10 is provided that includes an upper surface 10a, and defining a recess 11 having an opening 11a in the upper surface 10a. As described above, the package 10 includes lead terminals 14A and 14B and a base body 13. The method of producing the light-emitting device of the present disclosure can be used to produce a single light-emitting device 101, or a plurality of light-emitting devices 101 at once. In the case in which a plurality of light-emitting devices 101 are produced at once, a plurality of packages 10 are provided. In order to increase manufacturing efficiency when mounting the light-emitting element 20 and when disposing the sealing member 30, etc., a plurality of packages 10 are preferably arranged on the same plane at a predetermined pitch. For example, as shown in FIG. 6A, a support substrate 300 is prepared, and a plurality of packages 10 are disposed on an upper surface of the support substrate 300 at a predetermined pitch such that the lower surface 10b of each package 10 is bonded to the upper surface of the support substrate 300.

Alternatively, as shown in FIG. 6C, a resin-molded lead frame 200, in which a plurality of packages 10 are integrally disposed, may be provided. The resin-molded lead frame 200 includes a lead frame 210 and an insulating member 220. As shown in FIGS. 6B and 6C, the lead frame 210 includes a plurality of package regions arranged in an x-direction and a y-direction which are orthogonal to each other. Each package region includes lead terminals 14A and 14B. In each package region, the lead terminals 14A and 14B are spaced apart from each other, and the lead terminal 14B is connected via a connection portion 211 to the lead terminal 14A in another package region adjacent thereto in the x-direction. The lead terminals 14A and 14B are also connected to the lead terminals 14A and 14B disposed in another package region adjacent thereto in the y-direction, by connection portions 212A and 212B.

The resin-molded lead frame 200 includes the lead frame 210 and the insulating member 220. The resin-molded lead frame 200 has a plurality of recesses 11 corresponding to the respective package regions, at an upper surface thereof. A portion of each of the lead terminals 14A and 14B is exposed from the bottom surface of the recess 11.

The resin-molded lead frame 200 is formed using the lead frame 210, and an insulating material that is to be the base body 13. The base body 13 can be molded by performing insert molding or the like.

Thus, using a lead frame having a resin in which a plurality of packages are connected together in the step (A) of providing a package allows the step (B) of disposing a light-emitting element in the package and step (D) of disposing an uncured sealing member, which are subsequent to the step (A), to be performed with respect to the plurality of packages, and allows the step (E) of curing the uncured sealing member while applying a centrifugal force to be performed with respect to each lead frame.

(B): Disposing Light-Emitting Element in Package (S2)

Figure 5B:
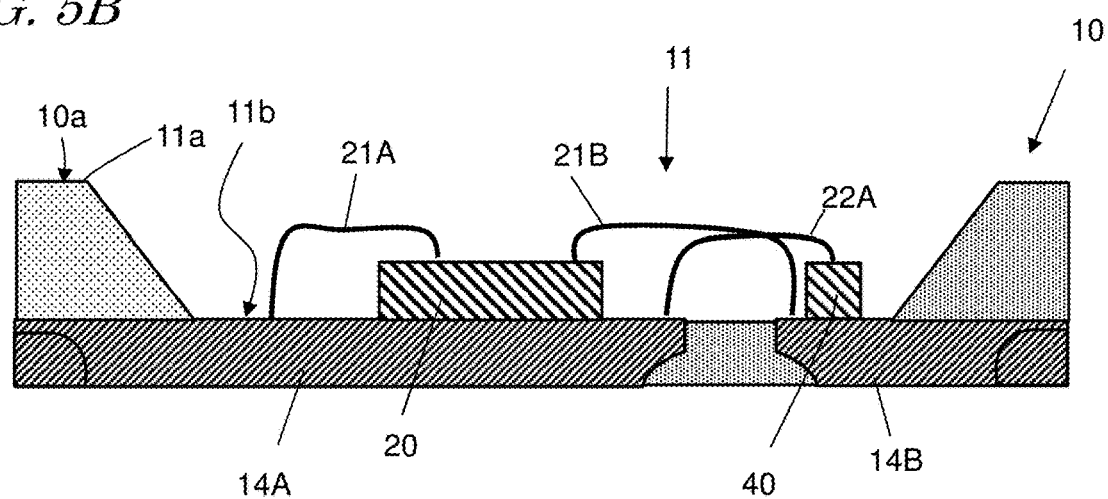
FIG. 5B is a schematic cross-sectional view for describing a step of disposing a light-emitting element in the method of producing the light-emitting device.

As shown in FIG. 5B, a light-emitting element 20 is disposed on the surface 11b defining the bottom of the recess 11 of the package 10. The light-emitting element 20 is provided, and is connected to the surface 11b defining the bottom of the recess 11 using an adhesive member. In this embodiment, the light-emitting element 20 is bonded to an upper surface of the lead terminal 14A. Likewise, a protective element 40 is bonded to an upper surface of the lead terminal 14B. Next, a pair of electrodes of the light-emitting element 20 are connected to the lead terminals 14A and 14B by conductive wires 21A and 21B, respectively. Likewise, an electrode of the protective element 40 is coupled to the lead terminal 14A by a conductive wire 22A.

(C): Disposing Light Reflective Member (S3)

Figure 5C:
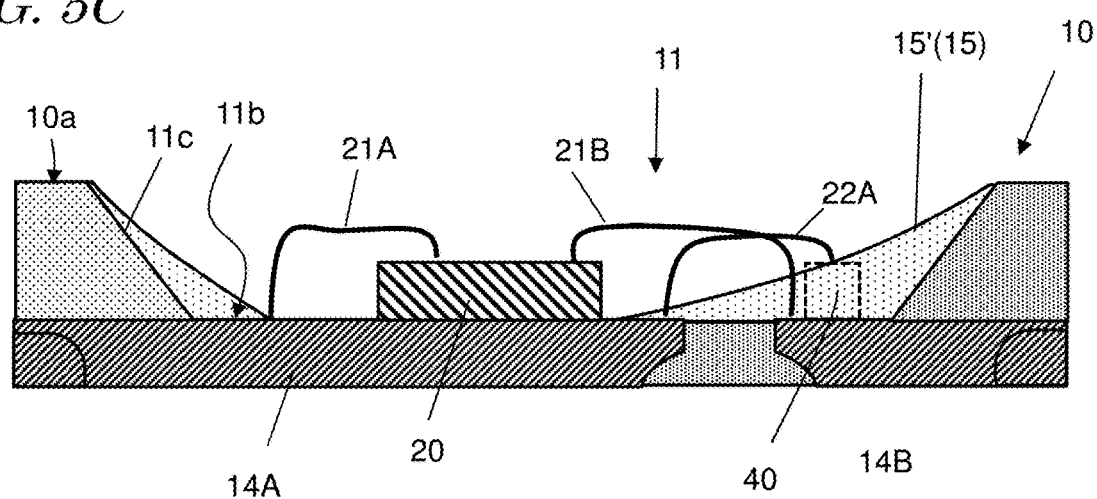
FIG. 5C is a schematic cross-sectional view for describing a step of disposing a light reflective member in the method of producing the light-emitting device.

In the case in which the light-emitting device 101 includes a light reflective member 15, a step of disposing the light reflective member 15 is preferably performed after the light-emitting element 20 is disposed. As shown in FIG. 5C, in the step of disposing the light reflective member 15, the light reflective member 15 is disposed in the recess 11 so as to cover the bottom surface of the recess 11 and inner lateral surface defining the recess 11. The light reflective member 15 is formed as described below. A light reflective substance is added to and dispersed in an uncured resin serving as a base material of the light reflective member 15, to prepare an uncured light reflective member 15'. Next, the uncured light reflective member 15' is disposed on the bottom surface of the recess 11 in a region between the light-emitting element 20 and the inner lateral surface 11c defining the recess 11. As a result, the uncured light reflective member 15' is spread to cover a portion of the surface 11b defining the bottom of the recess 11 and the inner lateral surface 11c defining the recess 11. At this time, an entirety or a portion of the protective element 40 and an entirety or a portion of the conductive wire 22A may be covered by the uncured light reflective member 15'. Thereafter, the uncured light reflective member 15' is cured by heating or the like. Thus, the light reflective member 15 is formed.

(D): Disposing Uncured Sealing Member (S4)

Figure 5D:
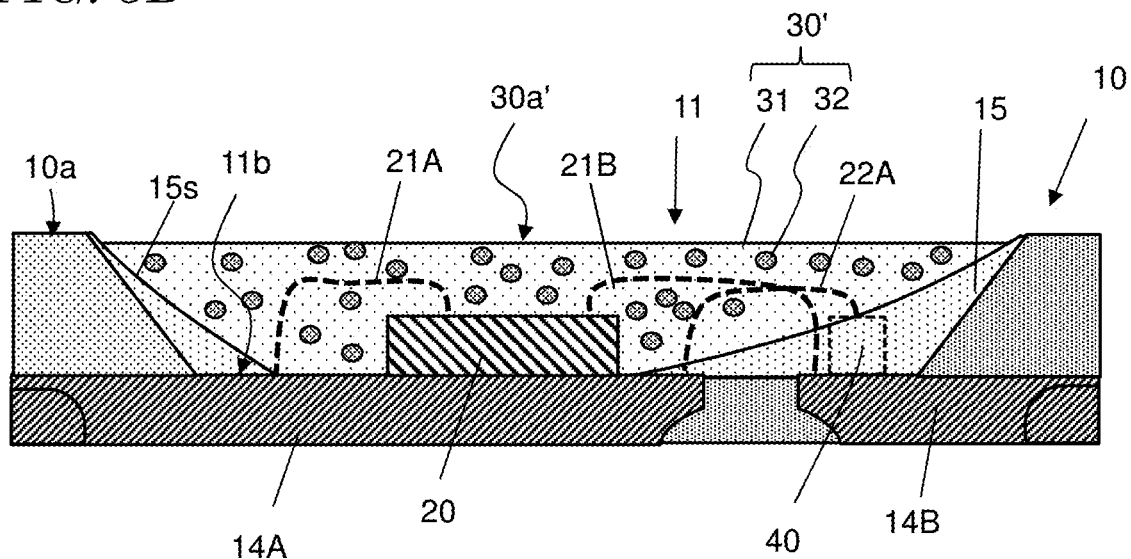
FIG. 5D is a schematic cross-sectional view for describing a step of disposing an uncured sealing member in the method of producing the light-emitting device.

As shown in FIG. 5D, an uncured sealing member containing a silicone resin is disposed in the recess 11 of the package 10. An uncured sealing member 30' is prepared. For the uncured sealing member 30', an uncured silicone resin in which a wavelength conversion member 32 is added and dispersed is prepared. The uncured sealing member 30' thus prepared is disposed in the recess 11 of the package 10 using a dispenser or the like. At this time, the uncured sealing member 30' is disposed such that the uncured sealing member 30' does not overflow from the opening 11a of the upper surface 10a of the package 10 and does not cover the upper surface 10a. The uncured sealing member 30' preferably covers an entirety of the light-emitting element 20, an entirety of the protective element 40, and an entirety of the conductive wires 21A, 21B, and 22A, which are located in the recess 11. In consideration of resin overflow during potting, the uncured sealing member 30' is preferably disposed in the recess 11 of the package 10 such that the upper surface of the uncured sealing member 30' is located lower than the upper surface 10a of the package 10. If the upper surface 10a is flush with the upper surface of the uncured sealing member 30', the uncured sealing member 30' is likely to be spread onto the upper surface 10a before a centrifugal force is applied in the next step.

(E): Curing Uncured Sealing Member while Applying Centrifugal Force (S5)

Figure 7A:
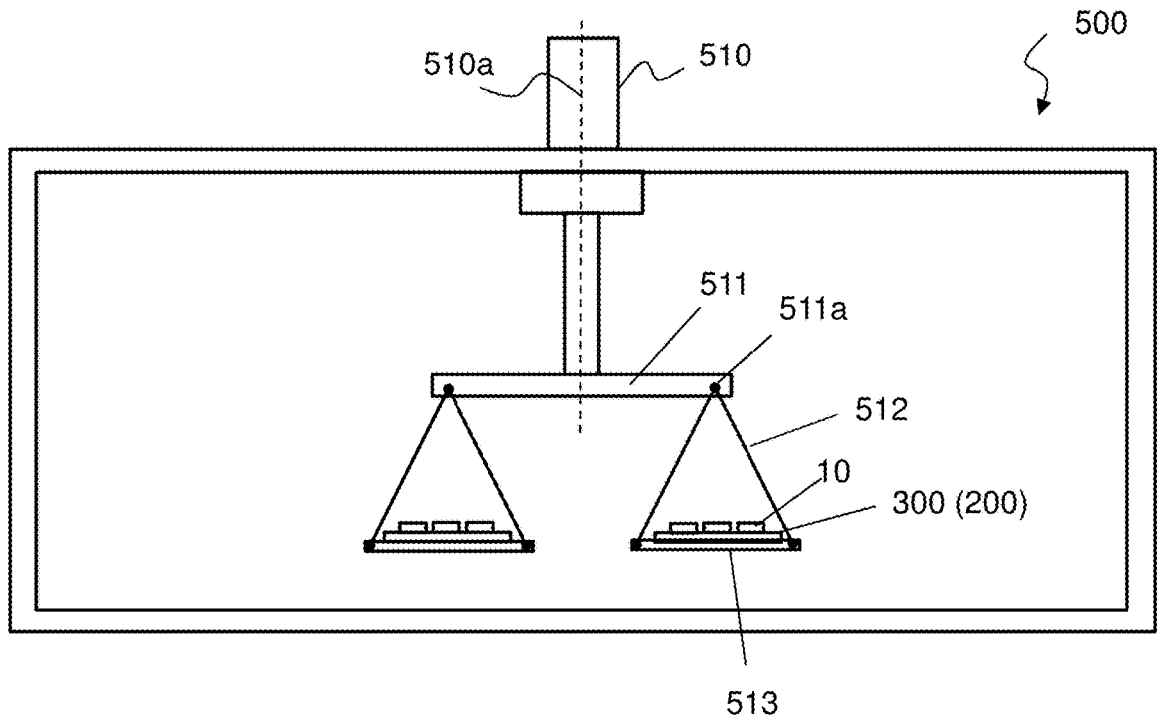
FIG. 7A is a schematic diagram showing an oven used in the method of producing the light-emitting device.

The uncured sealing member 30' disposed in the recess 11 of the package is cured while a centrifugal force is applied to the package in a direction perpendicular to the upper surface and toward the surface 11b defining the bottom of the recess 11. As shown in FIG. 7A, an oven 500 including a rotation mechanism configured to hold and rotate the package 10 to apply a centrifugal force to the package 10 is provided. The oven 500 includes a rotation mechanism 510 having an arm 511. The arm 511 is, for example, configured to be rotated around the center of the arm 511 in the longitudinal direction. Support frames 512 are attached to both ends of the arm 511. Each support frame 512 is provided with a support portion 513, which is configured to support the support substrate 300 on which a plurality of packages 10 are disposed or the resin-molded lead frame 200. The support frames 512, at both ends of the arm 511, are configured to rotate around an axis 511a located in a plane perpendicular to an axis 510a of rotation of the rotation mechanism 510 and parallel to a tangential direction of a circle having the axis 510a of rotation as the center of the circle.

Figure 7B:
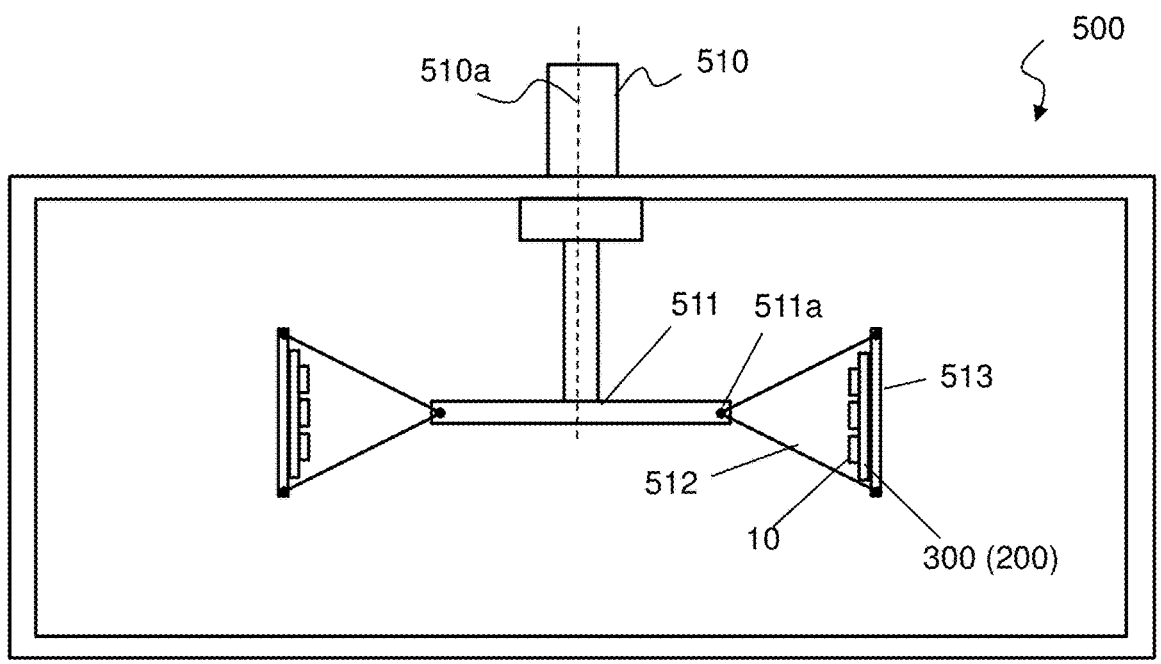
FIG. 7B is a schematic diagram showing how a centrifugal force is applied to the package using the oven in the method of producing the light-emitting device.

The support substrate 300 or the resin-molded lead frame 200 that has been subjected to the steps (A) to (D) is placed on the support portion 513 of the support frame 512, and the rotation mechanism 510 is driven to rotate the arm 511. Accordingly, as shown in FIG. 7B, the support frame 512 experiences a centrifugal force, so that the support frame 512 is rotated around the axis 511a such that the support portion 513 becomes parallel to the axis 510a of rotation. As a result, as shown in FIG. 5D, the uncured sealing member 30' experiences a centrifugal force F in a direction perpendicular to the upper surface 10a of the package 10 and toward the surface 11b defining the bottom of the recess 11. In this state, the centrifugal force caused by the rotation does not act on the package 10 in a direction parallel to the upper surface 10a of the package 10, i.e., a direction parallel to the axis 511a.

The magnitude of the centrifugal force F is preferably 100 G (×g) or more in terms of relative centrifugal force (RCF). The centrifugal force F is sufficiently greater than the centrifugal force that allows a wavelength conversion member to sediment when the uncured sealing member 30' contains the wavelength conversion member. The magnitude of the centrifugal force F, which varies depending on the type of the base material of the sealing member, the size of the recess 11, etc., is preferably 200 G or more, more preferably 300 G or more. The upper limit of the centrifugal force F is not particularly limited. However, if the centrifugal force F is excessively great, the structures formed through the steps (A)(D), such as the conductive wires 21A, 21B, and 22A formed in the recess 11, may be deformed. Also, in the case in which the sealing member 30 contains an additive material in addition to the wavelength conversion member, the additive material may not be distributed in the sealing member 30 as intended. Therefore, the centrifugal force F is preferably, for example, 500 G or less.

Figure 7C:
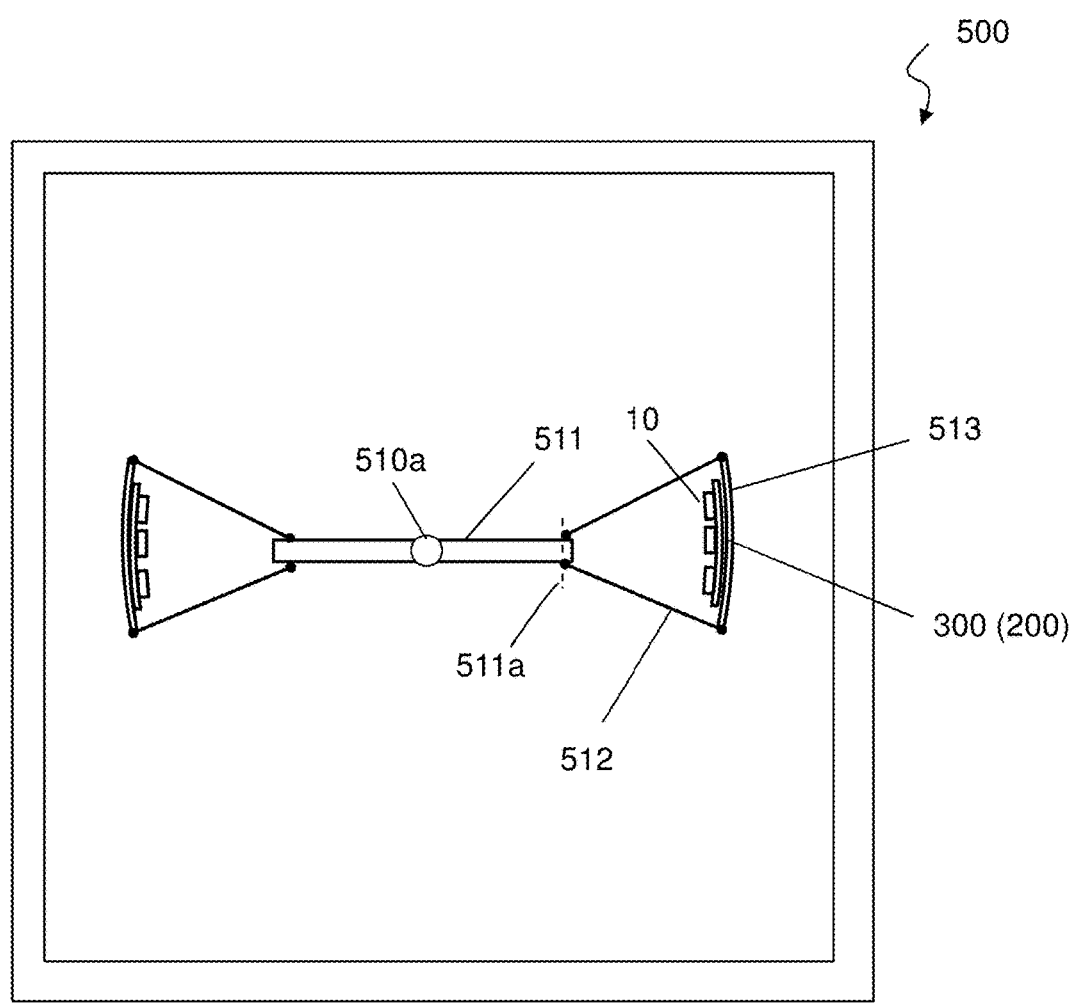
FIG. 7C is another schematic diagram showing how a centrifugal force is applied to the package using the oven in the method of producing the light-emitting device.

As shown in FIG. 7C, while the centrifugal force F is applied to the package 10, the support portion 513 may be allowed to be deformed so that a portion at and near the center of the support portion 513 of the support frame 512 is located further away from the center of rotation in a plane perpendicular to the axis 510a of rotation. This causes the support substrate 300 or the resin-molded lead frame 200 to be deformed into an arc shape in a plane perpendicular to the axis 510a of rotation, and the opposite ends of the support portion 513 are directed in the tangential direction. Accordingly, an entirety of the packages 10 on each support substrate 300 or the resin-molded lead frame 200 supported by the support portion 513 can more uniformly experience the centrifugal force F in a direction perpendicular to the upper surface 10a of the package 10.

Figure 5E:
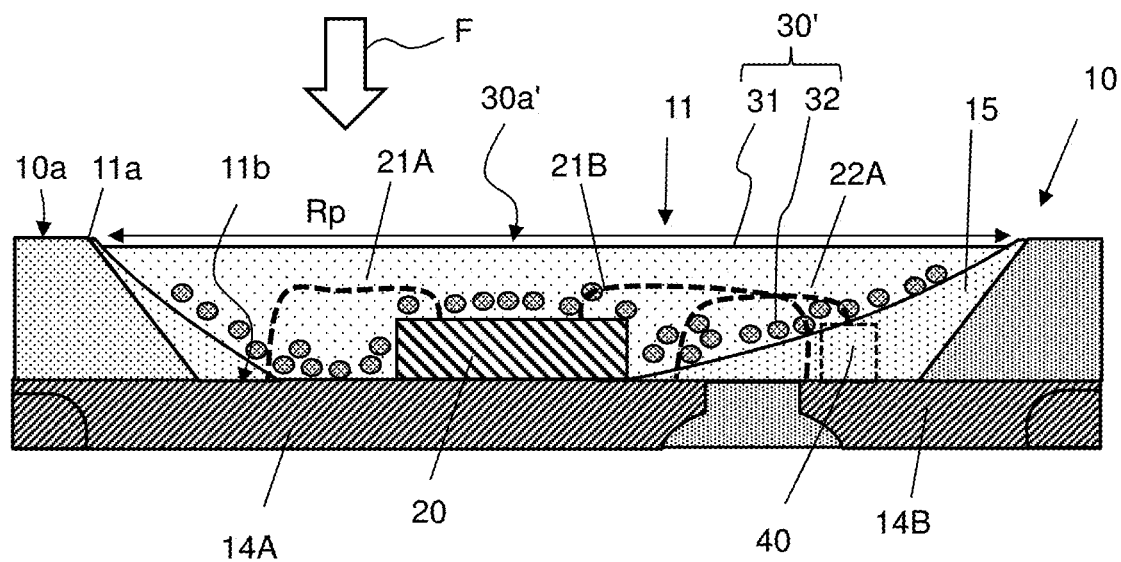
FIG. 5E is a schematic cross-sectional view for describing a step of curing the uncured sealing member in the method of producing the light-emitting device.

As shown in FIG. 5E, by applying the centrifugal force F, the upper surface 30a' of the uncured sealing member 30' can be maintained horizontal. By curing the uncured sealing member 30' in such a state, a large flat region Rp can be formed in the upper surface 30a'. Further, creep-up of the uncured sealing member 30' onto the upper surface 10a of the package 10 due to surface tension or the like can also be reduced.

In the case in which the uncured sealing member 30' contains the wavelength conversion member 32, such as a phosphor, the wavelength conversion member 32 is sedimented by the centrifugal force F, and is distributed predominantly at the surface 11b side of the recess 11.

As described above, the uncured sealing member 30' is cured in the presence of an applied centrifugal force. In the case in which a thermosetting resin is used for a base material of the sealing member 30', the uncured sealing member 30' can be cured by maintaining the package 10 at a temperature equal to or higher than a temperature that allows the uncured sealing member 30' to be cured, while applying a centrifugal force to the package 10. More specifically, the package 10 is heated in the oven 500 such that the temperature in the cavity of the oven 500 is maintained at a temperature, for example, equal to or higher than a temperature that allows a silicone resin to be cured. The temperature is maintained at, for example, 50° C. or higher. The temperature may be maintained for, for example, 0.5 to 4.0 hours.

When the uncured sealing member 30' begins to be cured, for example, a portion at and near the center of the upper surface 30a' may become recessed due to the shrinkage of the uncured sealing member 30'. However, due to application of the centrifugal force F, a portion of the uncured sealing member 30' is slightly moved in the recess 11 so that the entire upper surface 30a' becomes horizontal. Accordingly, the uncured sealing member 30' is cured with a large flat region Rp maintained, so that a sealing member 30 having an upper surface 30a including the large flat region Rp is disposed in the recess 11. This allows for obtaining a light-emitting device 101 in which the overflow of the sealing member 30 onto the upper surface is reduced. When the light-emitting devices 101 are produced for each resin-molded lead frame 200, i.e., on a lead frame-by-lead frame basis, separating into individual packages is performed subsequently.

In the case in which a UV-curable resin is used for a base material of the sealing member 30', the sealing member 30' is cured by irradiation with UV light in the presence of an applied centrifugal force. Alternatively, in the case in which a material that can be cured at room temperature is used for the base material, the sealing member 30' is cured at room temperature while a centrifugal force is applied thereto, so that a sealing member 30 having an upper surface 30a including the large flat region Rp is disposed in the recess 11.

(F) Separating into Individual Packages (S6)

The resin-molded lead frame 200 in which the sealing member 30 is disposed in the recess 11 of each package 10 is separated into the individual packages 10 by cutting the insulating member 220 and the connection portions 211, 212A, and 212B. Specifically, as indicated by dashed lines in FIG. 6D, separation into the individual packages 10 are performed by cutting the insulating member 220 and the connection portions 211, 212A, and 212B at boundaries between each package 10, using a blade or the like. As a result, the light-emitting device 101 is obtained. The separation into individual packages 10 can be performed using other known techniques, such as laser processing.

Examples

Figure 8:
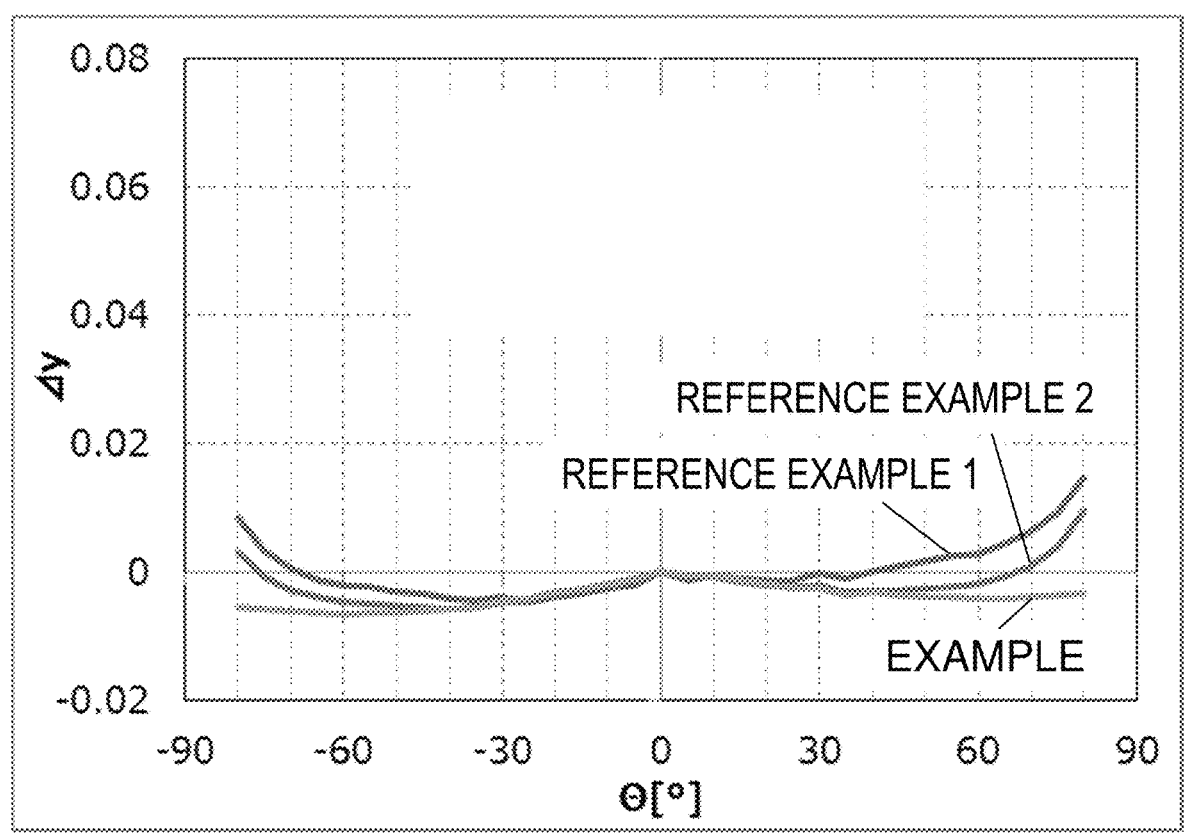
FIG. 8 is a diagram showing the light distribution angle dependency of chromaticity deviation in the light-emitting device of the embodiment.

A light-emitting device according to one embodiment was produced, and the light distribution angle dependency of chromaticity of light emitted from the light-emitting device was investigated. A result of the investigation will be described below. FIG. 8 is a diagram showing deviations of a chromaticity coordinate y depending on a directional angle in the light-emitting device 101 (Example 1) that was produced according to the method of producing the light-emitting device of the embodiment described above. In FIG. 8, the horizontal axis represents a light distribution angle, and the vertical axis represents a deviation of the y-value in a CIE chromaticity diagram, where 0° is a reference. Reference Example 1 indicates the result of measurement of a light-emitting device that was produced in a manner in which a centrifugal force was applied to a package according to the step (E) and thereafter the rotation of the rotation mechanism 510 was stopped, and then the uncured sealing member 30' was cured without applying a centrifugal force. Reference Example 2 indicates the result of measurement of a light-emitting device that was produced according to a conventional method of producing in which a centrifugal force was not applied to a package.

As shown in FIG. 8, in Example 1, Δy is negative when the absolute value of the light distribution angle is greater than 0°, while the value of Δy is generally constant in a range in which the absolute value of the light distribution angle is in the range of 30-80°. In contrast to this, in Reference Example 2, as the absolute value of the light distribution angle increases from 0°, the value of Δy changes from negative to positive, i.e., greatly changes. In particular, Δy increases in the case in which the absolute value of the light distribution angle is in the range of greater than 60°. These results shows that, according to the light-emitting device of one embodiment, deviation in chromaticity is reduced particularly in a region with a greater light distribution angle.

Further, in the light-emitting device of Reference Example 1, while light distribution angle dependency of chromaticity similar to that of the light-emitting device of Reference Example 2 was observed chromaticity deviation was reduced to some degree.

The light-emitting device of the present disclosure can be preferably used in various applications, such as luminaire applications, in-vehicle applications, display devices, and electronic devices.

While certain embodiments of the present invention have been described above, it will be apparent to those skilled in the art that the disclosed invention may be modified in numerous ways and may assume many embodiments other than those specifically described above. Accordingly, it is intended for the appended claims to cover all modifications of the invention that fall within the true spirit and scope of the invention.

What is claimed is:

1. A method of producing a light-emitting device, the method comprising:
    providing a lead frame comprising a plurality of package portions that are connected together, each package portion having an upper surface and a recess including an opening located at the upper surface;
    disposing, in each package portion, a light-emitting element on a surface that defines a bottom of the recess;
    disposing an uncured light reflective member in the recess of each package portion;
    curing the uncured light reflective members, thereby forming a cured light reflective member in the recess of each package portion;
    after forming the cured light reflective member in the recess of each package portion, disposing an uncured sealing member in the recess of each package portion;
    applying a centrifugal force to the lead frame, with the uncured sealing member disposed in each recess, wherein the centrifugal force is applied to each package portion in a direction toward the surface that defines the bottom of the recess, and wherein the centrifugal force causes a part of an upper surface of each uncured sealing member to be formed into a flat region; and
    curing the uncured sealing members while applying the centrifugal force to the lead frame such that the flat region of the upper surface of each uncured sealing member is maintained, thereby forming, in the recess of each package portion, a cured sealing member having an upper surface that includes a flat region; wherein:
    in the steps of applying the centrifugal force and curing the uncured sealing members, the lead frame is deformed by the centrifugal force while the centrifugal force is applied to the lead frame; and
    the flat region of the upper surface of each cured sealing member is located below the upper surface of the corresponding package portion.

2. The method of producing according to claim 1, wherein:
    each uncured sealing member contains a wavelength conversion member.

3. The method of producing according to claim 1, wherein:
    a magnitude of the centrifugal force is 100×g(rcf) or more and 500×g(rcf) or less.

4. The method of producing according to claim 1, wherein:
    in the step of curing the uncured sealing members, a centrifugal force is not applied in a direction parallel to the upper surfaces of the package portions.

5. The method of producing according to claim 1, wherein:
    the step of curing the uncured sealing members comprises applying the centrifugal force to the package portions while heating the package portions.

6. The method of producing according to claim 1, wherein:
    each uncured sealing member contains a silicone resin.

7. The method of producing according to claim 1, further comprising:
    after the step of curing the uncured sealing members while applying the centrifugal force, separating the plurality of package portions into individual packages.

8. The method of producing according to claim 1, wherein:
    in the step of disposing the uncured light reflective member in the recess of each package portion, the uncured light reflective members comprise an uncured resin in which a light reflective substance is dispersed.

9. The method of producing according to claim 8, wherein:
    the light reflective substance comprises light reflective particles of titanium oxide, zinc oxide, silicon oxide, zirconium oxide, aluminum oxide, or aluminum nitride.

10. The method of producing according to claim 1, wherein:
    the cured light reflective member contacts a lateral surface defining the recess and contacts the surface defining the bottom of the recess.

11. The method of producing according to claim 10, wherein:
    the cured light reflective member is spaced apart from lateral surfaces of the light-emitting element.

12. The method of producing according to claim 1, wherein:
    the flat region of the upper surface of the cured sealing member includes at least a region directly above the light-emitting element.

13. The method of producing according to claim 1, wherein:
    the flat region makes up 80% or more of a surface area of the upper surface of the cured sealing member.

14. The method of producing according to claim 1, wherein:
    in the step of applying the centrifugal force, another part of the upper surface of each uncured sealing member is formed into a sloped region located outward of the flat region; and
    in the step of curing the uncured sealing members, the upper surface of each cured sealing member includes a sloped region located outward of the flat region.

15. The method of producing according to claim 14, wherein:
    the sloped region defines an angle of more than 3 degrees with respect to the upper surface of the corresponding package portion.

16. The method of producing according to claim 1, wherein:
    the step of curing the uncured sealing members comprises applying the centrifugal force to the package portions while heating the package portions in an oven; and
    the step of curing the uncured sealing members comprises curing the uncured sealing members while applying the centrifugal force to the lead frame and while each uncured sealing member is uncovered and directly exposed to an atmosphere in the oven.

\* \* \* \* \*